(12) United States Patent
Kuan et al.

(10) Patent No.: US 8,203,145 B2
(45) Date of Patent: Jun. 19, 2012

(54) STRUCTURE FOR BUMPED WAFER TEST

(75) Inventors: Francis Heap Hoe Kuan, Singapore (SG); Byung Tai Do, Singapore (SG); Lee Huang Chew, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/019,643

(22) Filed: Feb. 2, 2011

(65) Prior Publication Data
US 2011/0121295 A1      May 26, 2011

Related U.S. Application Data

(62) Division of application No. 11/464,726, filed on Aug. 15, 2006, now Pat. No. 7,901,956.

(51) Int. Cl.
*H01L 23/488* (2006.01)
(52) U.S. Cl. .................. 257/48; 257/738; 257/E23.023
(58) Field of Classification Search .................... 257/48, 257/738
See application file for complete search history.

(56) References Cited

U.S. PATENT DOCUMENTS

| 6,878,963 B2 | 4/2005 | Fang |
| 2004/0089954 A1 | 5/2004 | Hembree et al. |

*Primary Examiner* — Alexander Ghyka
(74) *Attorney, Agent, or Firm* — Robert D. Atkins; Patent Law Group: Atkins & Associates, P.C.

(57) ABSTRACT

A semiconductor device includes a substrate having a first conductive layer disposed on a top surface of the substrate. A first insulation layer is formed over the substrate and contacts a sidewall of the first conductive layer. A second conductive layer is formed over the first insulation layer. The second conductive layer includes a first portion disposed over the first conductive layer and a second portion that extends beyond an end of the first conductive layer. A second insulation layer is formed over the second conductive layer. A first opening in the second insulation layer exposes the first portion of the second conductive layer. A second opening in the second insulation layer away from the first opening exposes the second portion of the second conductive layer. The second insulation layer is maintained around the first opening. A conductive bump is formed over the first portion of the second conductive layer.

27 Claims, 7 Drawing Sheets

STRUCTURE FOR BUMPED WAFER TEST

CLAIM TO DOMESTIC PRIORITY

The present application is a division of U.S. patent application Ser. No. 11/464,726, filed Aug. 15, 2006, and claims priority to the foregoing parent application pursuant to 35 U.S.C. §120.

FIELD OF THE INVENTION

The present invention relates in general to semiconductor devices and, more particularly, to a bumped semiconductor structure, including a method of manufacturing the bumped structure to easier facilitate testing.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

Typically, a plurality of individual chips are fabricated from a single wafer of substrate which incorporates individual subcomponents of the specific chip. The substrate can be a silicon or gallium arsenide substrate, or similar. The plurality of individual chips must be tested to determine whether the chips are good chips, repairable bad chips and non-repairable bad chips. Repairable bad chips can be laser repaired and retested. The good chips are singulated from the wafer into a plurality of individual chips. The chips are then packaged and again retested before they are shipped.

FIGS. 1a-1d depicts an example method of manufacturing a "bumped" semiconductor structure 10 which is tested for quality and reliability. A wafer 12 is first provided (FIG. 1a). The wafer 12 includes a bond pad 14 which is disposed over a top surface of the wafer 12. A water passivation layer 16 is disposed over the bond pad 14. Turning to FIG. 1b, an under bump metallurgy (UBM) 18 is disposed over the passivation layer 16. FIG. 1c depicts a solder ball 20 which is attached to the structure 10 and electrically contacts the UBM 18. Finally, turning to FIG. 1d, a probe needle 22 is utilized to carry out the testing process. Needle 22 comes into contact with the top of ball or "bump" 20 to provide electrical connectivity from ball 20 to needle 22 for the testing procedures.

By placing the needle 22 into contact with the top of bump 20 to conduct the testing as described in FIGS. 1a-1d, excessive bump 20 damage can result. The damage can ultimately result in electrical failure of the semiconductor structure 10. In addition, excessive bump 20 damage can also lead to problems such as internal voids which remain after the structure 10 is attached to a flip chip or similar semiconductor device.

Finally, solder "buildup", which refers to a situation where solder sticks to needle 22, will also occur during the testing process of structure 10. The buildup of solder material on needle 22 contributes to subsequent bump 20 damage as the needle 22 makes contact with additional bumps 20 during contact testing.

As a result, a need exists for a bumped semiconductor structure which allows for testing with a conventional needle 22 without the necessity of needle 22 coming into contact with the top surface of bump 20. Accordingly, a need also exists for a method of manufacturing the bumped semiconductor structure which alleviates the previously described problems. The structure and method of manufacturing the structure should take manufacturing, cost and efficiency constraints into account.

SUMMARY OF THE INVENTION

In one embodiment, the present invention is a semiconductor device comprising a substrate having a first conductive layer disposed on a top surface of the substrate. A first insulation layer is formed over the substrate and contacts a sidewall of the first conductive layer with an opening exposing a top portion of the first conductive layer. A second conductive layer is formed over the first insulation layer. A first portion of the second conductive layer is disposed over the first conductive layer, and a second portion of the second conductive layer extends beyond an end of the first conductive layer. A second insulation layer is formed over the second conductive layer with a first opening that exposes the first portion of the second conductive layer, and a second opening away from the first opening exposes the second portion of the second conductive layer while maintaining the second insulation layer around the first opening. A conductive bump is formed over the first portion of the second conductive layer.

In another embodiment, the present invention is a semiconductor device comprising a substrate with a first conductive layer formed over the substrate. A first insulation layer is formed over the substrate and first conductive layer. A second conductive layer is formed over the first conductive layer and first insulation layer. A first portion of the second conductive layer is formed over the first conductive layer, and a second portion is formed beyond the first conductive layer. A second insulation layer is formed over the second conductive layer and first insulation layer. A first opening is formed in the second insulation layer over the first portion of the second conductive layer, and a second opening is formed in the second insulation layer over the second portion of the second conductive layer. The second insulation layer is maintained around the first opening, and a bump is formed over the first opening.

In another embodiment, the present invention is a semiconductor device comprising a substrate. A first conductive layer is formed over the substrate. A first insulation layer is formed over the substrate and first conductive layer. The first insulation layer has a first thickness over the first conductive layer and a second thickness greater than the first thickness formed over an area beyond the first conductive layer. A second conductive layer is formed over the first conductive layer and first insulation layer. The second conductive layer includes a first portion formed over the first conductive layer and a second portion formed over an area beyond the first conductive layer. A second insulation layer is formed over the second conductive layer and first insulation layer. The second insulation layer has a first opening that exposes the second conductive layer and a second opening that exposes the second portion of the second conductive layer. The second insulation layer is maintained around the first opening.

In still another embodiment, the present invention is a semiconductor device comprising a substrate. A first conductive layer is formed over the substrate. A first insulation layer is formed over the substrate and contacts a sidewall of the first conductive layer. An opening in the first insulation layer exposes a top portion of the first conductive layer. A second conductive layer is formed over the first conductive layer and first insulation layer. The second conductive layer includes a first portion formed over the first conductive layer and a second portion formed over an area beyond the first conductive layer. A second insulation layer is formed over the second conductive layer and first insulation layer. The second insulation layer has a first opening that exposes the second conductive layer and a second opening that exposes the second portion of the second conductive layer.

BRIEF DESCRIPTION OF THE DRAWINGS

FIG. 1b illustrates a second step in the prior art method of manufacturing began with FIG. 1a;

FIG. 1c illustrates a third step in the prior art method of manufacturing began with FIG. 1a;

FIG. 1d illustrates a final, fourth step in the prior art method of manufacturing began with FIG. 1a;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A bumped semiconductor structure can be manufactured which serves to alleviate many of the problems previously described, while maintaining cost effectiveness and efficiency in the manufacturing process. The structure eliminates the need for a probe needle to come directly into contact with a bump for testing procedures, thus alleviating possible bump damage and solder buildup.

Figure 1A:
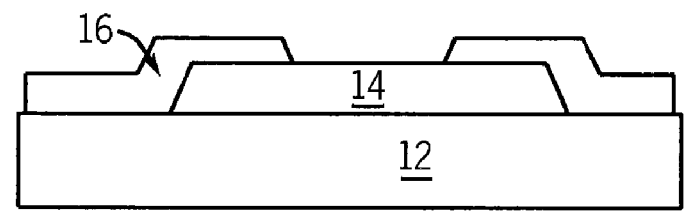
FIG. 1a illustrates a first step in an example prior art method of manufacturing an embodiment of a bumped semiconductor structure which is connected to a flip chip semiconductor device or an equivalent.
Figure 1B:
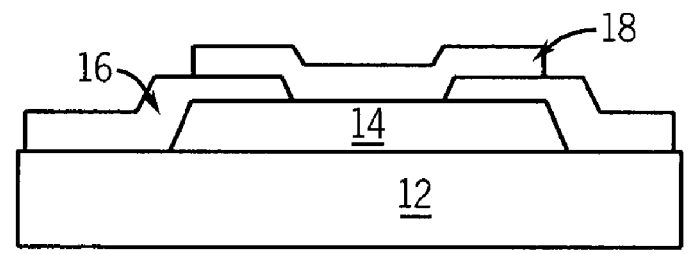
Figure 1C:
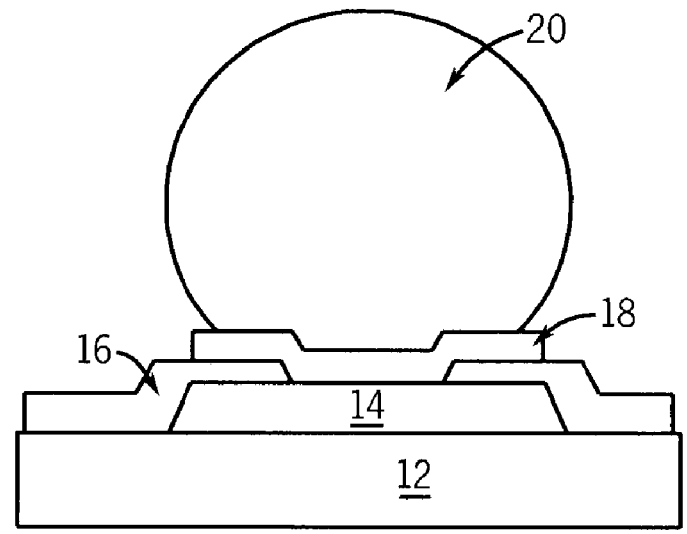
Figure 1D:
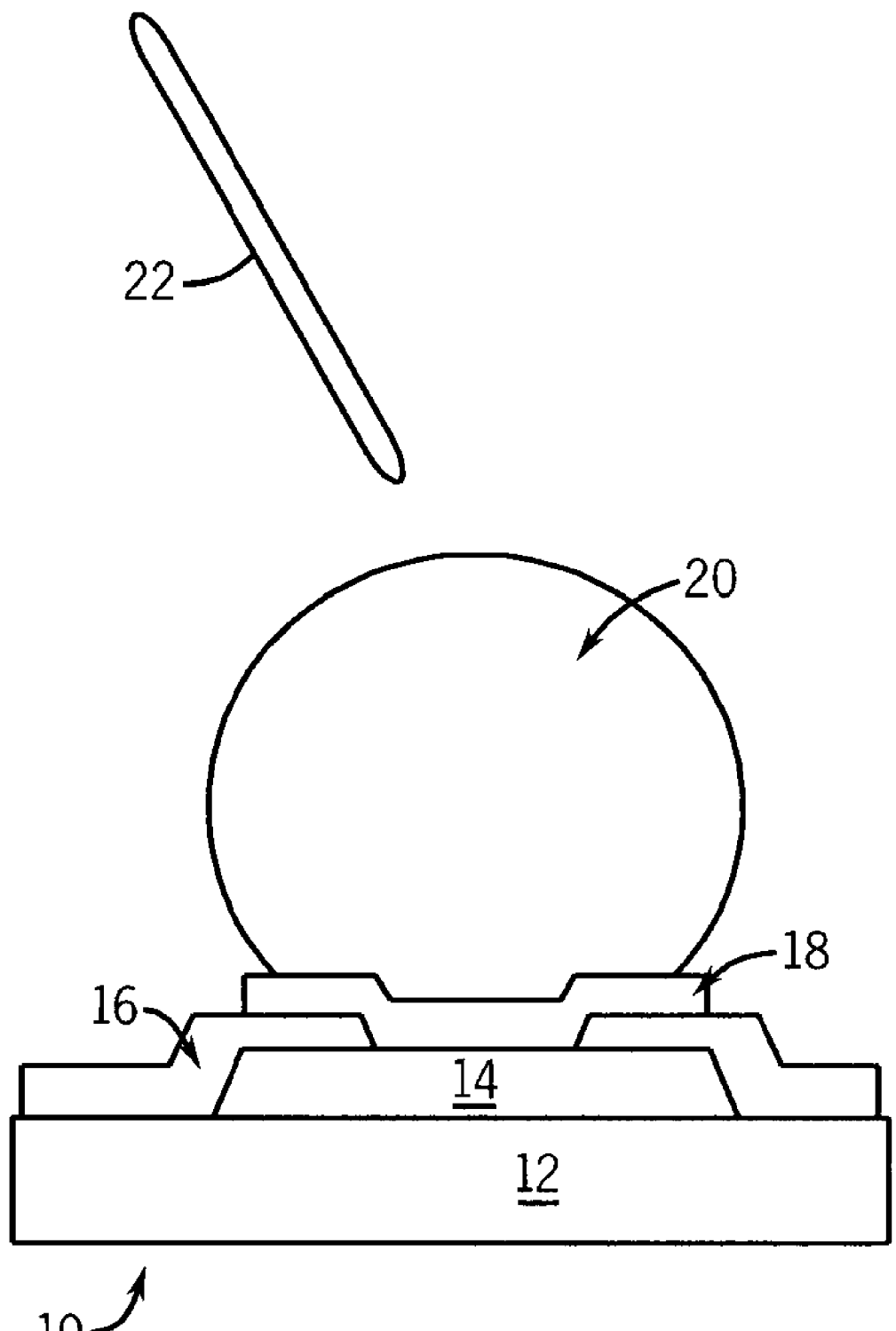
Figure 2A:
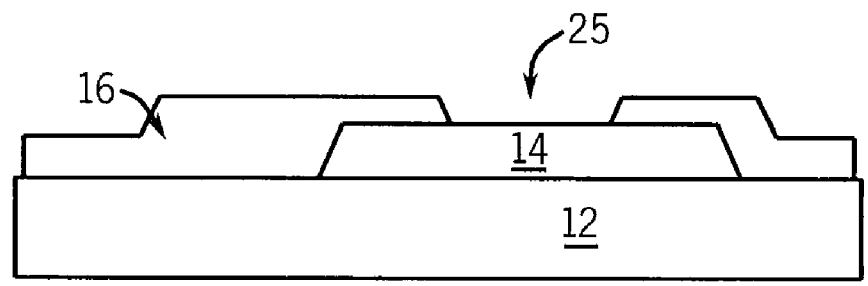
FIG. 2a illustrates a first step in an example method of manufacturing a bumped semiconductor structure according to the present invention.

Turning to FIG. 2a, a method of manufacturing a bumped semiconductor structure 24 for bumped wafers processed by a Flex-on-Cap process is depicted. FIG. 2a shows a provided wafer substrate 12 with an included bond pad 14 which is again disposed on a top surface of the substrate 12. As a next step, a wafer passivation layer 16 is disposed over the wafer 12 and bond pad 14. An opening 25 in the passivation layer 16 allows a portion of the top surface of the bond pad 14 to continue to be exposed.

Figure 2B:
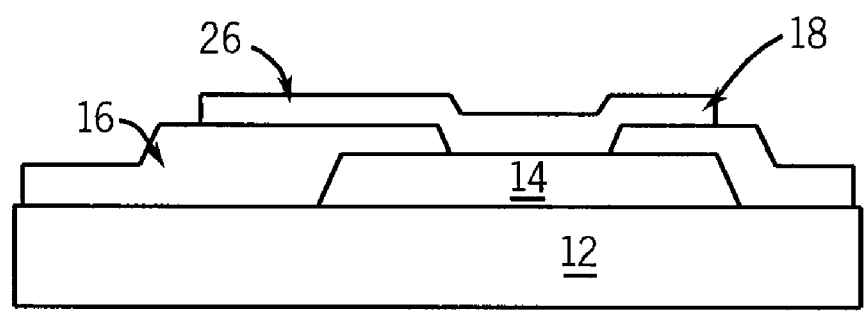
FIG. 2b illustrates a second step in an example method of manufacturing a bumped semiconductor structure according to the present invention.

FIG. 2b depicts the deposition of an under bump metallurgy UBM 18 which is formed over the wafer passivation layer 16. The UBM 18 is formed over the opening 25 in layer 16, which allows the UBM 18 to conform to the opening 14 to form an inset structure. An extension 26 portion of the UBM is also formed. An end of the extension 26 serves to extend substantially beyond an end of the bond pad 14. The extension 26 receives structural support from a portion of the passivation layer 16 which is shown with an increased thickness under the bottom surface of the UBM extension 26.

Figure 2C:
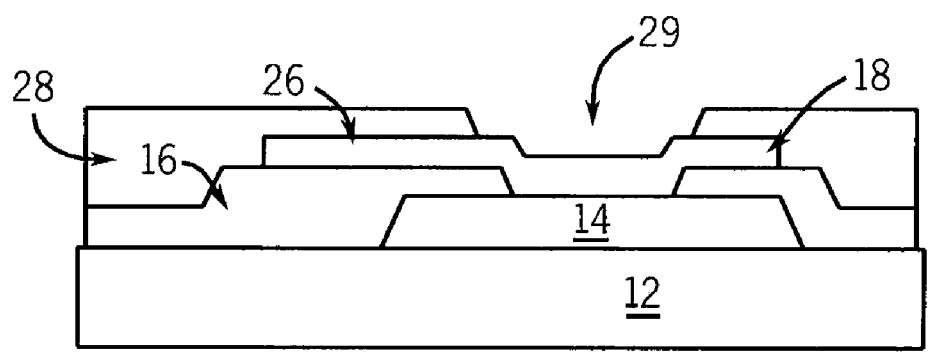
FIG. 2c illustrates a third step in an example method of manufacturing a bumped semiconductor structure according to the present invention.

The structure 24 then undergoes repassivation (FIG. 2c). A second wafer passivation layer 28 is formed over a portion of the UBM 18, UBM extension 26, and the first wafer passivation layer 16. A first opening 29 is formed in the repassivation layer 28 which allows the UBM 18 to continue to be exposed to provide electrical connectivity, and to provide a conforming surface to a solder ball.

Figure 2D:
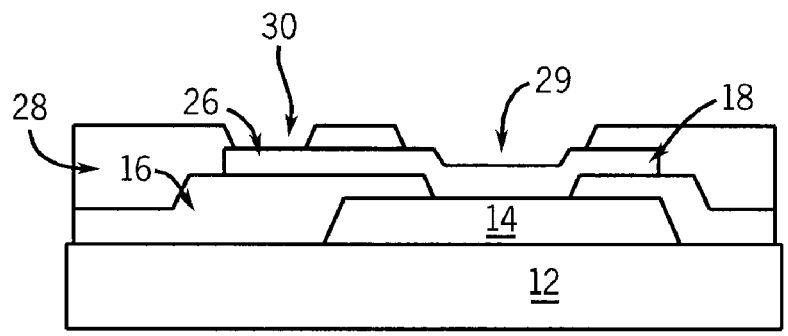
FIG. 2d illustrates a fourth step in an example method of manufacturing a bumped semiconductor structure according to the present invention.

FIG. 2d illustrates the process of etching a second opening 30 in the second passivation layer 28 of structure 24. Opening 30 is made to expose the UBM extension 26 portion.

Figure 2E:
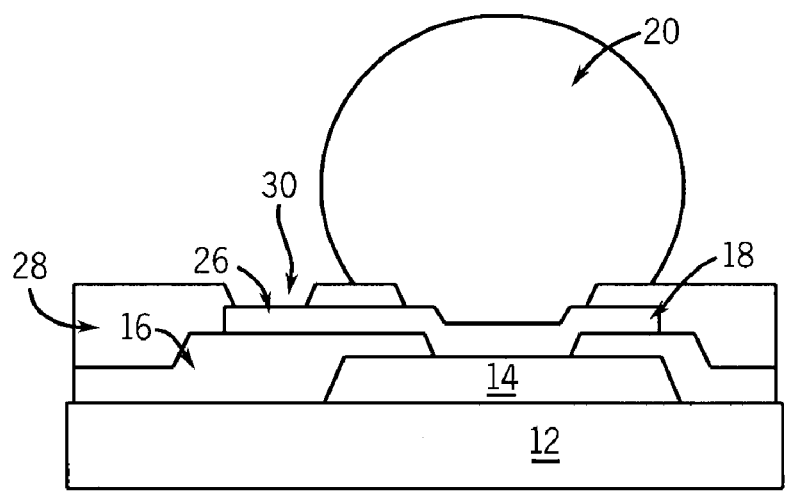
FIG. 2e illustrates a fifth step in an example method of manufacturing a bumped semiconductor structure according to the present invention.

Referring to FIG. 2e, a bump 20 or solder ball 20 is then attached to the first opening 29 in UBM 18. UBM 18 provides electrical connectivity to bump 18. The extension 26 also provides remote electrical connectivity to solder ball 18 through UBM 18. The process of attaching a bump 20 or etching an opening 30 can be performed using techniques known in the art.

Figure 2F:
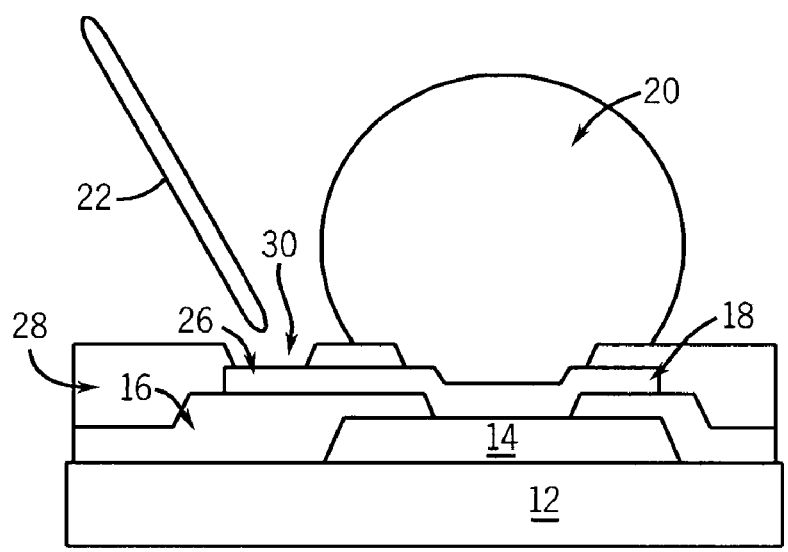
FIG. 2f illustrates a final, sixth step in an example method of manufacturing a bumped semiconductor structure according to the present invention.

Finally, probe needle 22 is shown in FIG. 2f, which can make electrical contact with the UBM extension 26 and thereby UBM 18 and solder ball 20 to perform contact testing procedures without the need for needle 22 to make contact with a top surface of solder ball 20.

Opening 30 allows for needle 22 to carry out electrical testing on the bumped wafer structure 24 without damaging the bump 20. The configuration of extension 26 in structure 24 reduces potential problems such as an uncontrollable solder collapse or an irregular solder shape, as the embodiment 24 shown retains the exact same collapsed solder height and shape as prior art structure 10. At the same time, structure 24 does not increase risk of electrical shorting due to foreign material, because the extended UBM portion 26 is isolated from the environment by the repassivation layer 28.

Structure 24 as described is compatible with a variety of semiconductor devices which would be attached to the bumps 20, such as all flip chip semiconductor devices manufactured by known methods. Additionally, structure 24 is compatible with all known manufacturing methods such as the previously described Flex-on-Cap, Repassivation, and Redistribution methods.

Figure 3A:
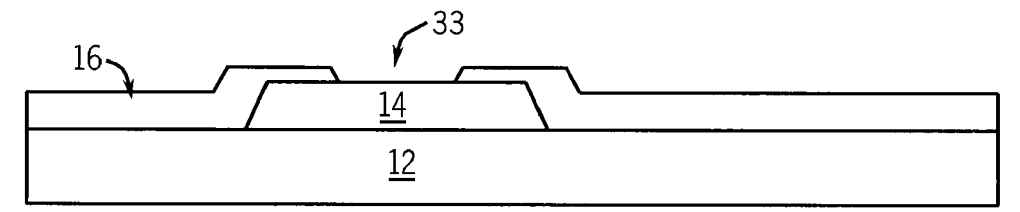
FIG. 3a illustrates a first step in a second example method of manufacturing a bumped semiconductor structure according to the present invention.

Turning to FIG. 3a, a second example method of manufacturing a bumped semiconductor structure 32 for bumped wafers processed by a Redistribution process is depicted. Again, as a first step, a wafer substrate 12 is provided which has a bond pad 14 incorporated on a top surface of the wafer 12. A first wafer passivation layer 16 is deposited over the wafer 12 and bond pad 14, while an opening 33 is left in the layer 16 to allow the bond pad 14 to continue to be exposed.

Figure 3B:
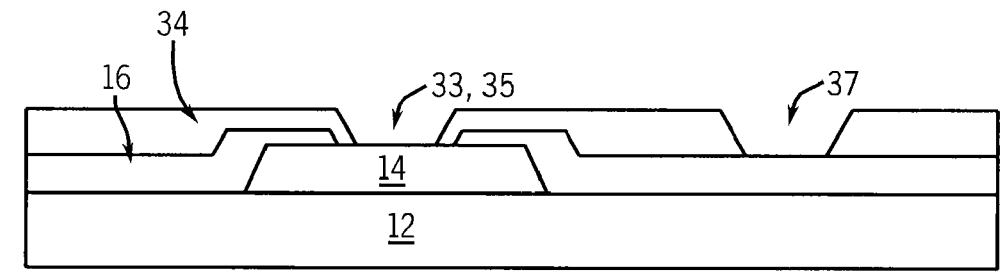
FIG. 3b illustrates a second step in a second example method of manufacturing a bumped semiconductor structure according to the present invention.

As a next step, FIG. 3b shows a first dielectric layer 34 being deposited over the wafer passivation layer 16. A first opening 35 is left in dielectric layer 34 to allow the bond pad 14 to continue to be exposed. A second opening 37 in layer 34 allows a portion of the passivation layer 16 to be exposed. The exposed portion of the passivation layer lies beyond the surfaces of the bond pad layer, as shown.

Figure 3C:
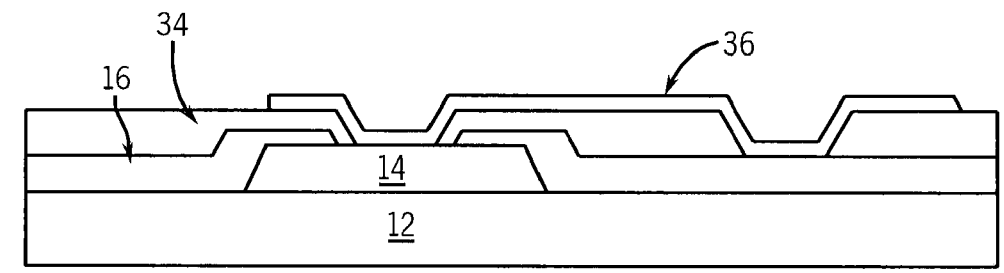
FIG. 3c illustrates a third step in a second example method of manufacturing a bumped semiconductor structure according to the present invention.

FIG. 3c shows a redistribution layer (RDL) 36 which is disposed over a portion of the dielectric layer 34. RDL 36 conforms to the first and second openings 35, 37 in the dielectric layer 34, forming inset surfaces in the structure 32.

Figure 3D:
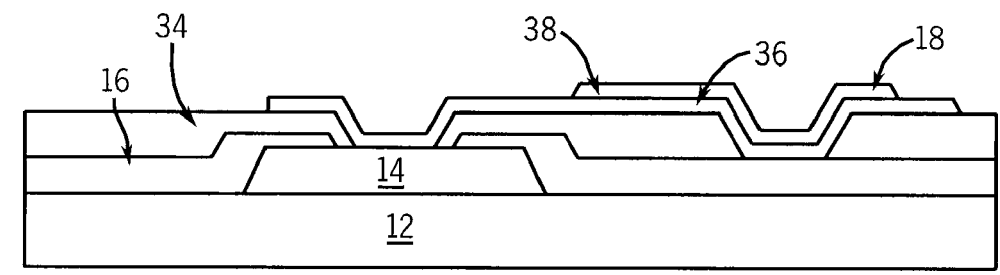
FIG. 3d illustrates a fourth step in a second example method of manufacturing a bumped semiconductor structure according to the present invention.

As a next step, FIG. 3d shows a UBM 18 having an extension portion 38 formed over a portion of the structure 32 as shown. UBM 18 conforms to the region in structure 32 where the second opening 37 was formed in the layer 34. Extension portion 38 receives structural support from layers 16, 34, and 36.

Figure 3E:
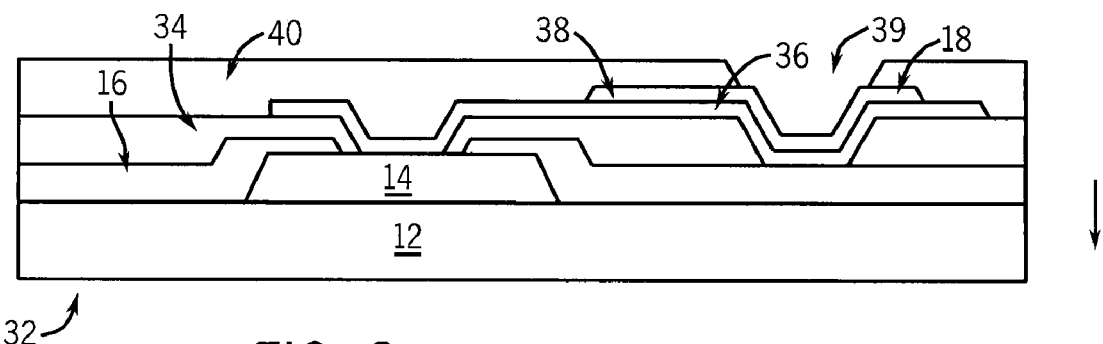
FIG. 3e illustrates a fifth step in a second example method of manufacturing a bumped semiconductor structure according to the present invention.
Figure 3F:
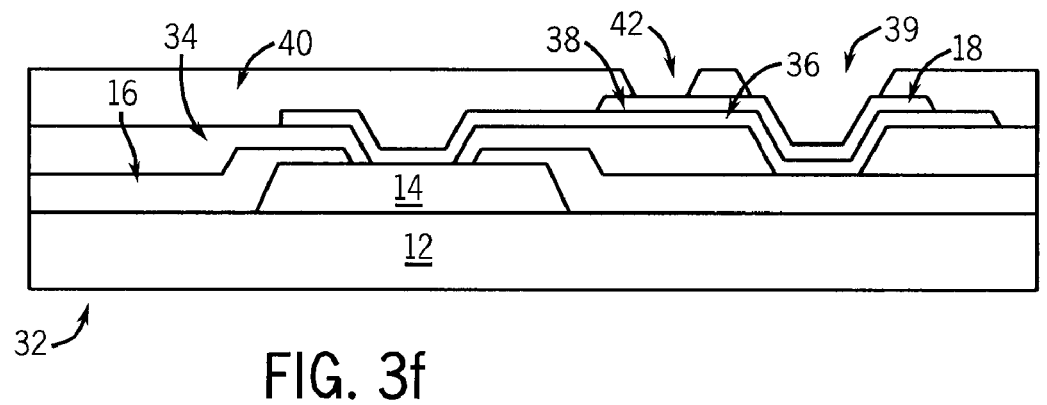
FIG. 3f illustrates a sixth step in a second example method of manufacturing a bumped semiconductor structure according to the present invention.

FIG. 3e shows a second dielectric layer 40 formed over the top surfaces of structure 32, covering portions of the layers 18, 34, 36, and 38 as shown. Referring to FIG. 3f, a first opening 39 is formed in layer 40 to expose a portion of the UBM 18 to conformingly receive a solder ball 20. A second opening 42 is etched into layer 40 to expose the extension portion 38 of UBM 18.

Figure 3G:
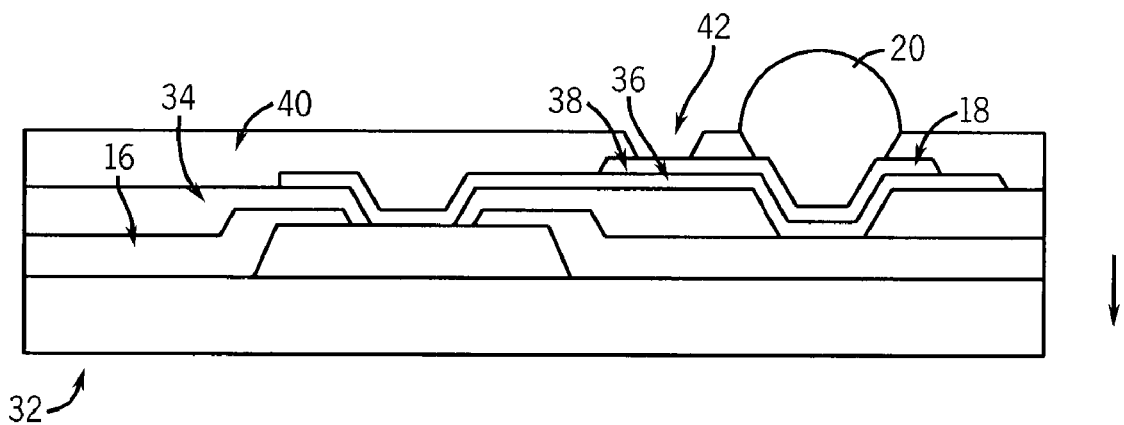
FIG. 3g illustrates a seventh step in a second example method of manufacturing a bumped semiconductor structure according to the present invention.

A solder ball 20 is attached to the top, exposed surface of UBM 18 as shown in FIG. 3g. Here, as before, electrical connectivity is made between the surface of UBM 18 and the ball 20.

Figure 3H:
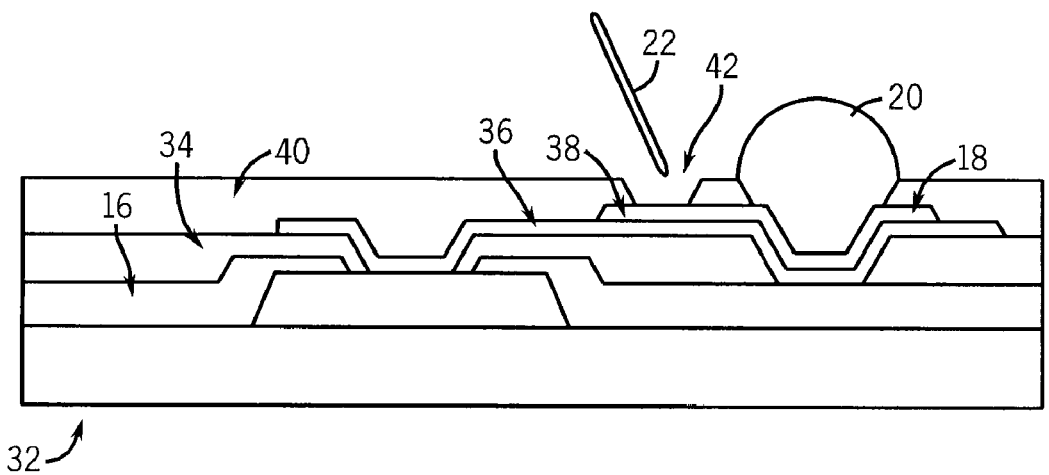
FIG. 3h illustrates a final, eighth step in a second example method of manufacturing a bumped semiconductor structure according to the present invention.

Finally, referring to FIG. 3h, a bumped wafer testing procedure on structure 32 is shown using needle probe 22 which is received into opening 42. Again, probe 22 makes electrical contact with UBM 18 at exposed extension portion 38 to carry out the testing procedures.

In the described example method of manufacturing a structure 32 using a Redistribution method, like the example Flex-on-Cap method first described, opening 42 allows for needle 22 to carry out electrical testing on the bumped wafer structure 32 without damaging the bump 20. The configuration of extension 38 in structure 32 reduces potential problems such as an uncontrollable solder collapse or an irregular solder shape, as the embodiment 32 shown retains the exact same collapsed solder height and shape as prior art structure 10. At the same time, structure 32 does not increase risk of electrical shorting due to foreign material, because the extended UBM portion 38 is isolated from the environment by the second dielectric layer 40.

The use of structures 24, 32 provide mechanisms for efficient and reliable testing procedures, yet still can be manufactured using known techniques and are compatible with existing semiconductors, such as any known flip chip semiconductor device. As a result, quality and reliability are increased at minimal manufacturing cost.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
   a substrate having a first conductive layer disposed on a surface of the substrate;
   a first insulating layer formed over the substrate including a first opening exposing the first conductive layer and a second opening laterally offset from the first conductive layer;
   a second conductive layer formed over the first insulating layer, wherein a first portion of the second conductive layer is disposed over the first conductive layer and conforms to the first opening while a second portion of the second conductive layer is laterally offset from the first conductive layer and conforms to the second opening;
   a second insulating layer formed over the second conductive layer with a first opening that exposes the second conductive layer and a second opening away from the first opening that exposes the second portion of the second conductive layer while maintaining the second insulating layer around the first opening; and
   a conductive bump formed over the second conductive layer.

2. The semiconductor device of claim 1, wherein the first insulating layer has a first thickness formed over an area laterally offset from the first conductive layer, and a second thickness less than the first thickness formed over the first conductive layer.

3. The semiconductor device of claim 1, wherein the conductive bump is solder and electrically connects to a flip-chip semiconductor device.

4. The semiconductor device of claim 1, wherein the first portion of the second conductive layer is conformally applied to and follows a contour of the first insulating layer and first conductive layer.

5. The semiconductor device of claim 1, wherein the second portion of the second conductive layer is configured to connect to a test probe such that the conductive bump is not damaged during an electrical test.

6. A semiconductor device, comprising:
   a substrate with a first conductive layer formed over the substrate;
   a first insulating layer formed over the substrate and first conductive layer;
   a second conductive layer formed over the first conductive layer and first insulating layer, wherein a first portion of the second conductive layer is formed over the first conductive layer and a second portion is formed laterally offset from the first conductive layer;
   a third conductive layer formed over the second portion of the second conductive layer;
   a second insulating layer formed over the second and third conductive layers and over the first insulating layer with a first opening formed in the second insulating layer over the second portion of the second conductive layer, and a second opening formed in the second insulating layer over the second portion of the second conductive layer while maintaining the second insulating layer around the first opening; and
   a bump formed over the first opening.

7. The semiconductor device of claim 6, wherein the first insulating layer has a first thickness formed over an area laterally offset from the first conductive layer, and a second thickness less than the first thickness formed over the first conductive layer.

8. The semiconductor device of claim 6, wherein the first insulating layer contacts a sidewall of the first conductive layer.

9. The semiconductor device of claim 6, wherein the first portion of the second conductive layer is conformally applied to and follows a contour of the first insulating layer and first conductive layer.

10. A semiconductor device comprising:
a substrate with a first conductive layer formed over the substrate;
a first insulation layer formed over the substrate and first conductive layer;
a second conductive layer formed over the first conductive layer and first insulation layer, wherein a first portion of the second conductive layer is formed over the first conductive layer and a second portion is formed beyond the first conductive layer;
a second insulation layer formed over the second conductive layer and first insulation layer with a first opening formed in the second insulation layer over the first portion of the second conductive layer, and a second opening formed in the second insulation layer over the second portion of the second conductive layer while maintaining the second insulation layer around the first opening; and
a bump formed over the first opening, wherein the second portion of the second conductive layer is configured to connect to a test probe such that the bump is not damaged during an electrical test.

11. The semiconductor device of claim 6, wherein the bump is conductive solder and electrically connects to a flip-chip semiconductor device.

12. A semiconductor device, comprising:
a substrate;
a first conductive layer formed over the substrate;
a first insulating layer formed over the substrate and first conductive layer, the first insulating layer having a first opening over the first conductive layer and a second opening laterally offset from the first conductive layer;
a second conductive layer formed over the first conductive layer and first insulation layer, the second conductive layer including a first portion formed in the first opening and a second portion formed in the second opening; and
a second insulating layer formed over the second conductive layer and first insulation layer, the second insulating layer having a first opening over the second portion of the second conductive layer and a second opening over the second portion of the second conductive layer that maintains the second insulating layer around the first opening.

13. The semiconductor device of claim 12, wherein a conductive bump is formed over the first or second opening of the second insulating layer.

14. The semiconductor device of claim 13, wherein the conductive bump is solder.

15. The semiconductor device of claim 13, wherein the conductive bump electrically connects to a flip-chip semiconductor device.

16. The semiconductor device of claim 12, wherein the first insulating layer contacts a sidewall of the first conductive layer.

17. The semiconductor device of claim 12, wherein the first portion of the second conductive layer is conformally applied to and follows a contour of the first insulating layer and first conductive layer.

18. The semiconductor device of claim 13, wherein the first or second portion of the second conductive layer is configured to connect to a test probe such that the conductive bump is not damaged during an electrical test.

19. A semiconductor device, comprising:
a substrate;
a first conductive layer formed over the substrate;
a first insulation layer formed over the substrate and contacting a sidewall of the first conductive layer with an opening exposing a top portion of the first conductive layer;
a second conductive layer formed over the first conductive layer and first insulation layer, the second conductive layer including a first portion formed over the first conductive layer and a second portion formed over an area beyond the first conductive layer;
a second insulation layer formed over the second conductive layer and first insulation layer, the second insulation layer having a first opening that exposes the second conductive layer and a second opening that exposes the second portion of the second conductive layer; and
a conductive bump formed over the first or second opening in the second insulation layer, wherein the first or second portion of the second conductive layer is configured to connect to a test probe such that the conductive bump is not damaged during an electrical test.

20. The semiconductor device of claim 19, wherein the conductive bump is solder.

21. The semiconductor device of claim 19, wherein the conductive bump electrically connects to a flip-chip semiconductor device.

22. The semiconductor device of claim 19, wherein the first portion of the second conductive layer is conformally applied to and follows a contour of the first insulating layer and first conductive layer.

23. The semiconductor device of claim 19, wherein the first insulation layer has a first thickness over the first conductive layer, and a second thickness greater than the first thickness formed over an area beyond the first conductive layer.

24. The semiconductor device of claim 10, wherein the first insulating layer has a first thickness formed over an area beyond the first conductive layer, and a second thickness less than the first thickness formed over the first conductive layer.

25. The semiconductor device of claim 10, wherein the first insulating layer contacts a sidewall of the first conductive layer.

26. The semiconductor device of claim 10, wherein the first portion of the second conductive layer is conformally applied to and follows a contour of the first insulating layer and first conductive layer.

27. The semiconductor device of claim 10, wherein the bump is conductive solder and electrically connects to a flip-chip semiconductor device.

* * * * *